(12) United States Patent
Wu et al.

(10) Patent No.: US 7,670,938 B2
(45) Date of Patent: Mar. 2, 2010

(54) METHODS OF FORMING CONTACT OPENINGS

(75) Inventors: David D. Wu, Austin, TX (US); Mark W. Michael, Cedar Park, TX (US)

(73) Assignee: GlobalFoundries, Inc., Grand Cayman (KY)

( * ) Notice: Subject to any disclaimer, the term of this patent is extended or adjusted under 35 U.S.C. 154(b) by 227 days.

(21) Appl. No.: 11/381,219

(22) Filed: May 2, 2006

(65) Prior Publication Data

US 2007/0259513 A1 Nov. 8, 2007

(51) Int. Cl.
*H01L 21/44* (2006.01)
(52) U.S. Cl. .............................. 438/597; 257/E21.243; 257/E21.244; 438/199; 438/744; 438/791
(58) Field of Classification Search .................. 438/597, 438/199, 744, 791; 257/E21.243, E21.244
See application file for complete search history.

(56) References Cited

U.S. PATENT DOCUMENTS

| 4,966,865 | A | 10/1990 | Welch et al. ................. 437/192 |
| 5,893,750 | A | 4/1999 | Hause et al. ................. 438/633 |
| 6,218,294 | B1 | 4/2001 | Lin et al. ..................... 438/652 |
| 7,303,955 | B2 * | 12/2007 | Kim ............................ 438/257 |
| 7,320,917 | B2 * | 1/2008 | Ohashi ........................ 438/278 |
| 7,442,598 | B2 * | 10/2008 | Grudowski et al. .......... 438/199 |
| 2003/0181005 | A1 * | 9/2003 | Hachimine et al. ........... 438/231 |
| 2004/0251479 | A1 * | 12/2004 | Tsutsui et al. ................ 257/249 |
| 2005/0260810 | A1 | 11/2005 | Cheng et al. ................. 438/199 |
| 2006/0017111 | A1 | 1/2006 | Kamiya et al. .............. 257/368 |
| 2006/0094193 | A1 * | 5/2006 | Horstmann et al. .......... 438/299 |
| 2006/0249794 | A1 * | 11/2006 | Teh et al. ..................... 257/369 |

OTHER PUBLICATIONS

PCT Search Report from PCT/US2007/007575 dated Oct. 9, 2007.

* cited by examiner

*Primary Examiner*—Eugene Lee
*Assistant Examiner*—Peniel M Gumedzoe
(74) *Attorney, Agent, or Firm*—Williams, Morgan & Amerson, P.C.

(57) ABSTRACT

The present invention is directed to methods of forming contact openings. In one illustrative embodiment, the method includes forming a feature above a semiconducting substrate, forming a layer stack comprised of a plurality of layers of material above the feature, the layer stack having an original height, reducing the original height of the layer stack to thereby define a reduced height layer stack above the feature, forming an opening in the reduced height layer stack for a conductive member that will be electrically coupled to the feature and forming the conductive member in the opening in the reduced height layer stack.

11 Claims, 4 Drawing Sheets

METHODS OF FORMING CONTACT OPENINGS

BACKGROUND OF THE INVENTION

1. Field of the Invention

The present invention is generally directed to the field of manufacturing semiconductor devices, and, more particularly, to methods of forming contact openings.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to increase the operating speed of the transistors, as well as integrated circuit devices incorporating such transistors.

Recently, various stress engineering techniques have been employed in an effort to increase transistor performance. For example, establishing a tensile stress in the channel region of an NMOS transistor can improve the mobility of electrons through the channel. Similarly, by establishing a compressive stress in the channel region of a PMOS transistor, the mobility of holes may be improved, thereby enhancing the performance of the PMOS transistor. Various techniques are used to induce such stresses in the channel regions of transistors. One technique generally involves the deposition of layers of material specifically designed to induce the desired stress within the channel region of the transistors. The manners in which the desired stress conditions may be established in such layers are well known to those skilled in the art.

A typical integrated circuit device will have both NMOS and PMOS transistors. This is particularly true for CMOS applications. Establishing the desired stresses in the channel regions of these different types of transistors can involve many difference process flows in which layers are formed and then partially or completely removed. In some cases, layers of material that induce different types of stress (tensile, compression) are formed on or above one another so as to effectively cancel out or reduce the net stress induced by the combination of both layers.

While the formation of such stress inducing layers can increase device performance, the formation of such layers can also create other problems as it relates to other aspects of manufacturing an integrated circuit. As is well known to those skilled in the art, after a functioning device, e.g., a transistor, a resistor, a capacitor, etc., is formed, electrical contacts are formed so that the device can be electrically coupled to other parts of the integrated circuit and thereby perform its intended function. In modern devices, such electrical connections are established in multiple layers of conductive lines and vias (so-called "metal layers"). For example, a typical microprocessor device may have seven or more layers of conductive lines and vias to establish the conductive interconnections for the microprocessor device.

The process of forming conductive interconnects typically involves, among other things, forming an opening through a layer of material formed above the underlying device or structure to which it is designed to make electrical connection.

FIG. 1 provides an illustrative example of a line of polysilicon 10 (field poly) formed above a substrate 12. Also depicted in FIG. 1 is a first protective layer 14, a second protective layer 15, a first stress inducing layer 16, and a second stress inducing layer 18. The protective layers 14, 15 may be comprised of, for example, silicon dioxide. The purpose of the protective layers 14, 15 is to protect the surface of the substrate 12. The protective layers 14, 15 may also act as an etch stop layer when patterning the first and/or second stress inducing layers 16, 18.

In the depicted example, the stress inducing layers 16, 18 are provided to induce a stress within a region of the substrate 12 that will act as a channel region for one or more transistors (not shown). In some cases, the stress inducing layers 16, 18 may be employed to introduce a desired stress condition in either the source region or drain region (or both) of a transistor. For example, the first stress inducing layer 16 may be used to establish a tensile stress within underlying portions of the substrate 12, whereas the second stress inducing layer 18 may be used to establish a compressive stress condition within underlying portions of the substrate 12. The manner in which such stress inducing layers are formed are well known to those skilled in the art. Such stress inducing layers 16, 18 may be comprised of a variety of materials, such as silicon nitride or the like, and they may be formed by a variety of processes, e.g., a plasma enhanced deposition process. Each of the layers 16, 18 may have a thickness ranging from approximately 500-1000 Å.

Ultimately, a conductive connection will have to be formed to the illustrative polysilicon line 10 depicted in FIG. 1. However, due to the large thickness or height of the layer stack 19 produced by the combination of the first and second stress inducing layers 16, 18, and perhaps the protective layers 14, 15, forming an opening through such a layer stack 19 can be difficult and time-consuming. For example, in the case where both of the layers 16, 18 are made of silicon nitride, a very long etching process may be required to etch through the combined thickness of the layers 16, 18, e.g., a combined thickness that may be on the order of approximately 1000-2000 Å. In addition to the long duration of the etching process, such an extended etching process may have other implications, e.g., it may require the formation of protective layers or masks having additional thickness in other areas of the substrate.

The present invention is directed to various methods and systems that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to methods of forming contact openings. In one illustrative embodiment, the method comprises forming a feature above a semiconducting substrate, forming a layer stack comprised of a plurality of layers of material above the feature, the layer stack having an original height, reducing the original height of the layer stack to thereby define a reduced height layer stack above the feature, forming an opening in the reduced height layer stack for a conductive member that will be electrically coupled to the feature and forming the conductive member in the opening in the reduced height layer stack.

In another illustrative embodiment, the method comprises forming a feature above a semiconducting substrate comprised of silicon, forming a layer stack comprised of a plurality of layers of material above the feature, the layer stack having an original height, performing a chemical mechanical polishing process to reduce the original height of the layer stack to thereby define a reduced height layer stack above the feature, forming an opening in the reduced height layer stack for a conductive member that will be electrically coupled to the feature and forming the conductive member in the opening.

In yet another illustrative embodiment, the method comprises forming a feature above a semiconducting substrate comprised of silicon, forming a layer stack comprised of a plurality of layers of material above the feature, the layer stack having an original height, performing an etching process to reduce the original height of the layer stack to thereby define a reduced height layer stack above the feature, forming an opening in the reduced height layer stack for a conductive member that will be electrically coupled to the feature and forming the conductive member in the opening.

In a further illustrative embodiment, the method comprises forming a feature above a semiconducting substrate comprised of silicon, forming a layer stack comprised of a plurality of layers of material above the feature, the layer stack having an original height, spin-coating a layer of material on the substrate, thereby exposing at least a portion of the layer stack, performing an etching process on the exposed portions of the layer stack to reduce the original height of the layer stack and thereby define a reduced height layer stack, forming an opening in the reduced height layer stack for a conductive member that will be electrically coupled to the feature and forming the conductive member in the opening.

BRIEF DESCRIPTION OF THE DRAWINGS

The invention may be understood by reference to the following description taken in conjunction with the accompanying drawings, in which like reference numerals identify like elements, and in which.

Figure 1:
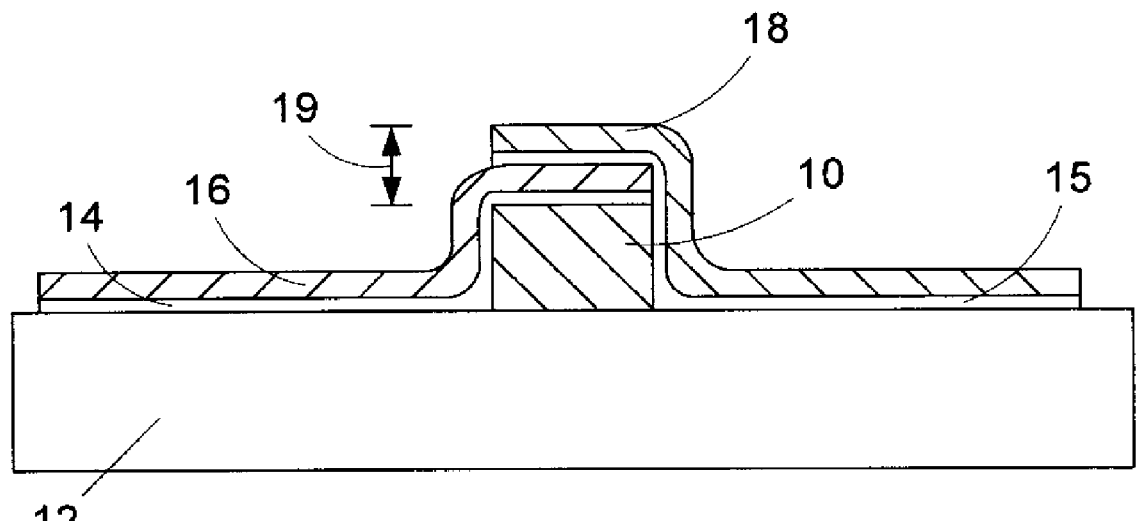
FIG. 1 is an illustrative example of a prior art substrate having a plurality of process layers formed thereabove.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2A:
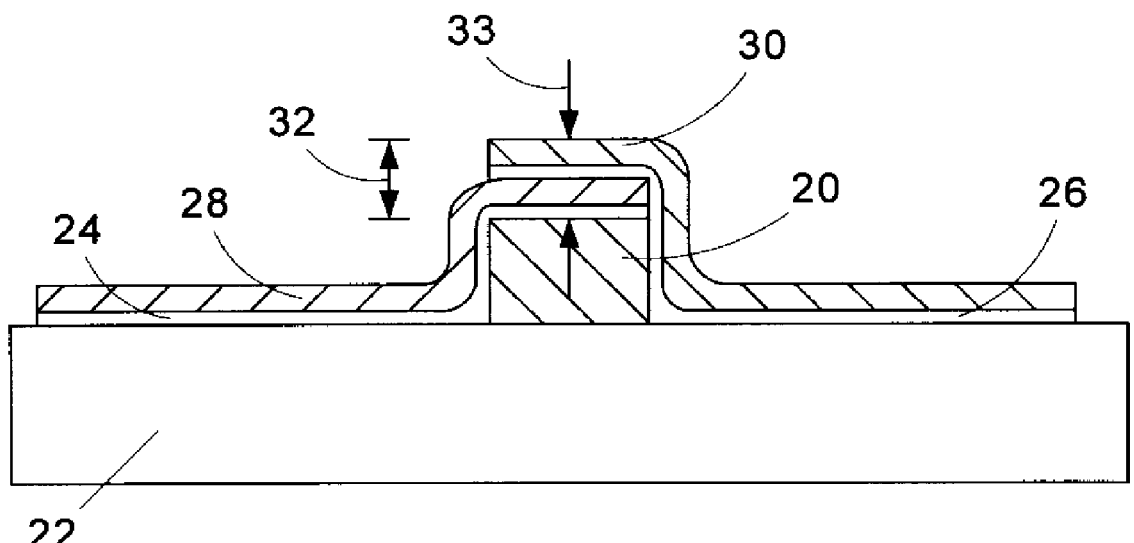
FIGS. 2A-2C depict one illustrative example of one aspect of the present invention.
Figure 2B:
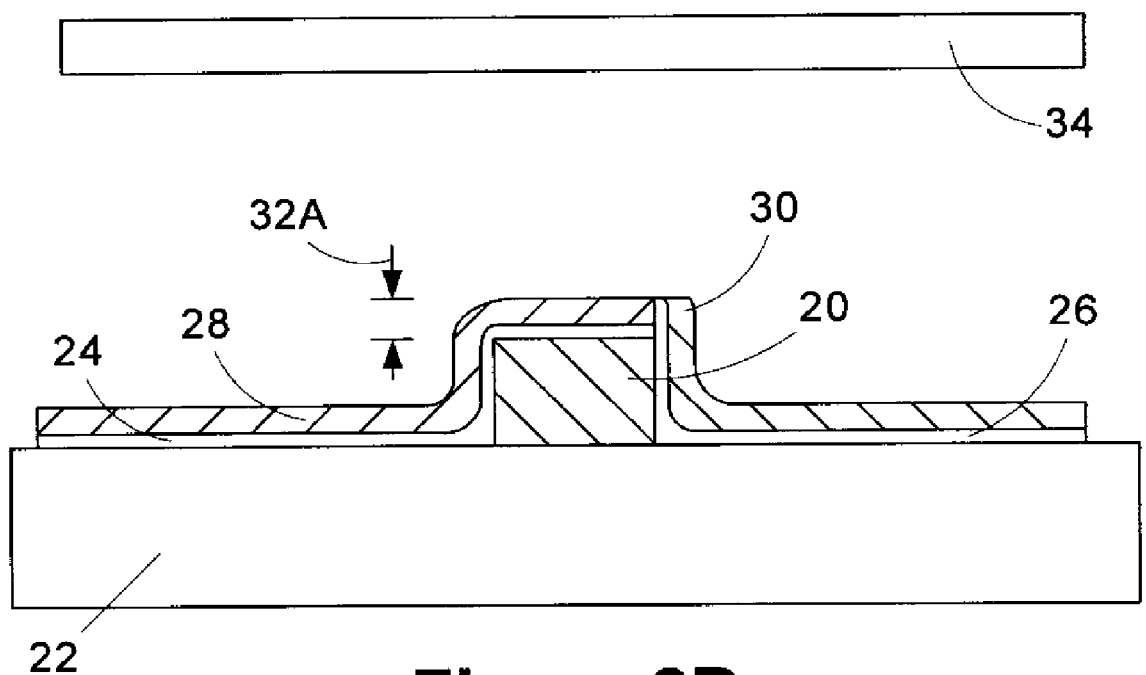
Figure 2C:
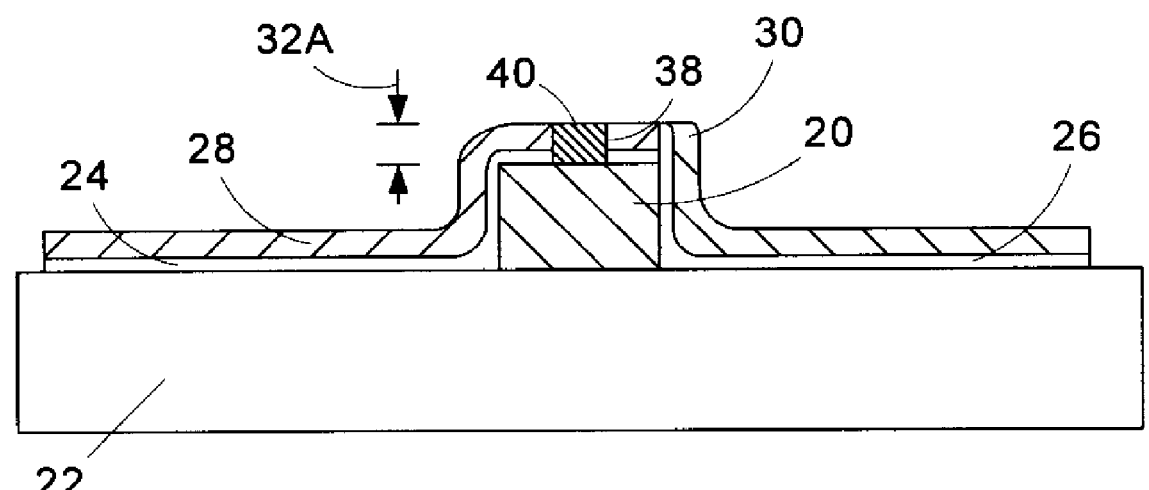

FIGS. 2A-2C depict one illustrative aspect of the present invention. As shown in FIG. 2A, a feature 20 is formed above a semiconducting substrate 22. The feature 20 may be any type of feature which will ultimately need to be contacted or coupled to a conductive interconnection (not shown). For example, the feature 20 may comprise a gate electrode structure, a resistor, a capacitor, a local interconnect, etc. As will be recognized by those skilled in the art after a complete reading of the present application, the present invention may be employed with many different types of features 20. Thus, the present invention should not be considered as limited to any particular type of feature 20.

In the illustrative example depicted herein, a plurality of protection or etch stop layers 24 and 26 may be formed above the substrate 22. The layers 24, 26 may be comprised of a variety of different materials, e.g., silicon dioxide, silicon oxynitride, etc. The layers 24, 26 may be formed by performing known deposition and/or oxidation processes, and their thickness may vary depending upon the particular application. In some applications, the layers 24, 26 may not be present.

FIG. 2A also depicts a plurality of process layers 28 and 30 that may be formed above the feature 20. Depending upon the particular application, the layers 28, 30 may be comprised of a variety of materials, they may be formed using a variety of known techniques, and they may be formed for a variety of purposes. For example, the layers 28, 30 may be comprised of silicon nitride, silicon oxynitride, etc. When the protective layers 24, 26 are employed, the layers 28, 30 will normally be formed of a material that is selectively etchable with respect to the underlying layers 24, 26. If the layers 24, 26 are not used, the layers 28, will be formed of a material that is selectively etchable with respect to the underlying feature 20. The layers 28, 30 may, in come cases, be layers designed to induce desired stress conditions in underlying portions of the substrate 22, as described previously with respect to FIG. 1. The thickness of each of the layers 28, 30 may vary, e.g., 500-1500 Å. The layers 28, 30 may be formed by performing a variety of known deposition processes. After they are originally deposited, the layers 28, 30 may be subjected to one or more etching processes to limit their coverage if desired.

As depicted in FIG. 2A, a layer stack 32 of process layers is formed above the feature 20. In the depicted embodiment, the layer stack 32 comprises the combination of layers 24, 26, 28 and 30. However, as indicated above, the composition of the layers that comprise the layer stack 32 is exemplary only, as it may vary depending upon the particular application. In some cases, the layer stack 32 may comprise at least the two process layers 28, 30. Irrespective of the exact number and type of layers that comprise the layer stack 32, the presence of the layer stack 32 above the feature 20 makes forming a contact to the underlying feature 20 difficult. In some cases, the layer stack 32 may have an original height 33 of approximately 1000-5000 Å.

In accordance with one aspect of the present invention, a partial planarization process may be performed to at least partially reduce the original height 33 of the layer stack 32 prior to beginning the process of forming an opening for a conductive contact to the feature 20. For example, as depicted in FIG. 2B, an illustrative chemical mechanical polishing (CMP) process, as indicated by the schematically depicted polishing pad 34, may be performed to remove at least a portion of the original layer stack 32, thereby resulting in a reduced height layer stack 32A formed above the feature 20. In the illustrative embodiment depicted in FIG. 2B, the illustrative CMP process is performed until such time as substantially all of the process layer 30 and the layer 26 are removed from above the feature 20. The duration of the CMP process may be relatively short as its purposes is to simply reduce the original height 33 of the original layer stack 32 prior to beginning the process of forming an opening for a conductive feature, e.g., a via, that will be electrically coupled to the feature 20. It is not required that the CMP process remove all of the layers 30, 26, although that may occur in some situations. The reduced height layer stack 32A should include sufficient material from the original layer stack 32 such that the remaining material can serve as an insulating material for the electrical connection to be formed to the feature 20.

Thereafter, as indicated in FIG. 2C, an opening 38 is formed in the reduced height layer stack 32A to enable electrical contact with the underlying feature 20. A conductive member 40 is ultimately formed in the opening 38. The opening 38 may be formed using a variety of known photolithography and etching processes. Similarly, the conductive member 40 may be comprised of a variety of different materials, and it may be formed using a variety of known techniques. For example, the conductive member 40 may be comprised of a metal, polysilicon, tungsten, copper, etc. Thus, the particular manner in which the opening 38 and conductive member 40 are formed, as well as the materials from which the conductive member 40 is formed, should not be considered a limitation of the present invention.

Figure 3A:
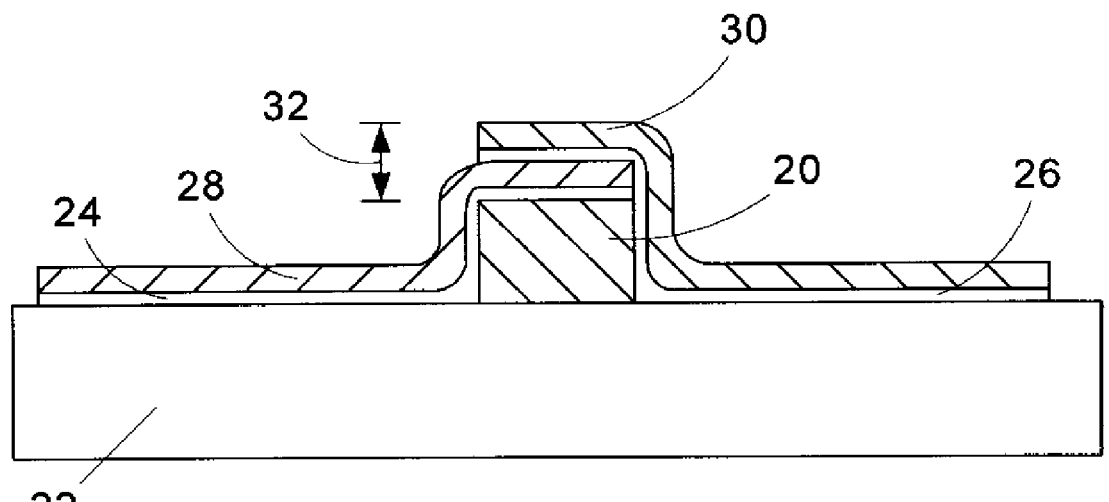
FIGS. 3A-3D depict yet another illustrative example of another aspect of the present invention.
Figure 3B:
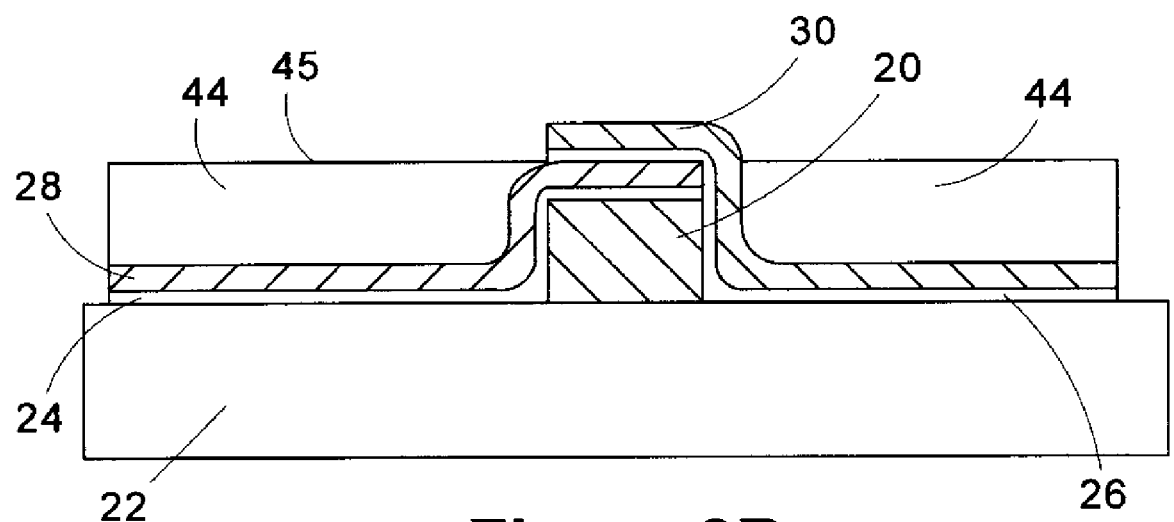

FIGS. 3A-3D depict another illustrative technique for reducing the height of the layer stack 32 formed above the feature 20. FIG. 3A is a duplication of FIG. 2A. The comments made above with respect to the items shown in FIG. 2A apply equally to FIG. 3A. In FIG. 3B, a layer of spin-on material 44 is formed above the structure depicted in FIG. 3A. The layer of spin-on material 44 may be comprised of any material that may be applied by a spin-on process, e.g., spin-on glass (SOG), a photoresist material, etc. Due to the manner in which it is applied, i.e., spin-coating, the layer of spin-on material 44 will tend to go to lower portions of the surface of the substrate 12. That is, due to the manner in which the spin-on material 44 is applied, it will leave at least some of the layer stack 32 exposed above the surface 45 of the layer of spin-on material 44.

Figure 3C:
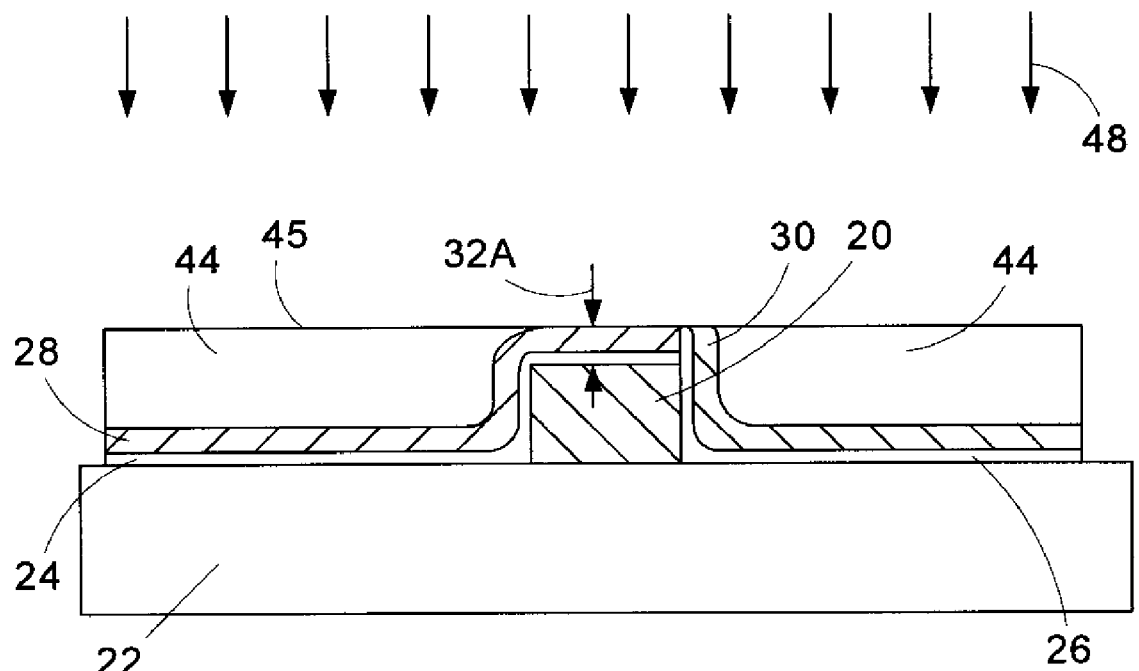

As indicated in FIG. 3C, an etching process, indicated by the arrows 48, may be performed to reduce the original height 33 of the layer stack 32, thereby resulting in a reduced height layer stack 32A. The etching process 48 may be, for example, an anisotropic etching process performed using known techniques. As with the CMP process described above, the etching process 48 may not remove the entirety of the layers 30, 26 in all cases, although that may happen in some applications. The reduced height layer stack 32A resulting from this process should likewise contain sufficient material to serve as an insulating material for the conductive contact to be formed to the feature 20.

Figure 3D:
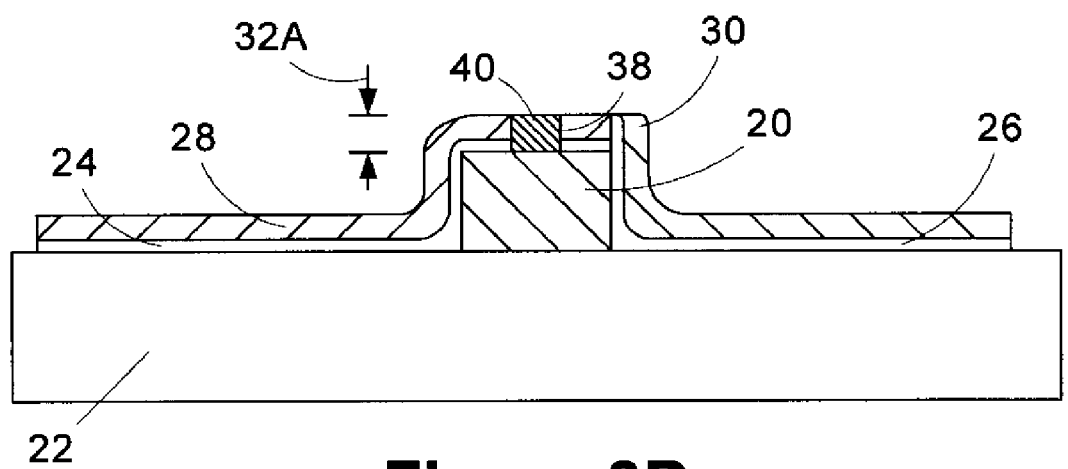

As shown in FIG. 3D, after the etching process 48 is performed, the opening 38 and the conductive member 40 may be formed as described previously. The layer of spin-on material 44 may or may not be removed prior to forming the opening 38 and conductive member 40. For clarity, the layer of spin-on material 44 is not depicted in FIG. 3D.

Generally, the present invention is directed to methods of forming contact openings. In one illustrative embodiment, the method comprises forming a feature above a semiconducting substrate, forming a layer stack comprised of a plurality of layers of material above the feature, the layer stack having an original height, reducing the original height of the layer stack to thereby define a reduced height layer stack above the feature, forming an opening in the reduced height layer stack for a conductive member that will be electrically coupled to the feature and forming the conductive member in the opening in the reduced height layer stack.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a feature above a semiconducting substrate;
    forming a plurality of stress-inducing layers above said substrate and said feature such that the stress-inducing layers overlap above said feature to form a layer stack above said feature, said layer stack having an original height that comprises at least a first overlapping portion and a second overlapping portion, each of the stress-inducing layers having a portion formed over said substrate for inducing a stress condition in said substrate;
    reducing said original height of said layer stack to thereby define a reduced height layer stack that comprises the first overlapping portion of the stress-inducing layers that overlap above said feature, wherein reducing said original height of said layer stack comprises removing the second overlapping portion of at least one of the stress-inducing layers in the layer stack while retaining the portions of the stress-inducing layers formed over said substrate in regions adjacent said feature;
    forming an opening in said reduced height layer stack for a conductive member that will be electrically coupled to said feature; and
    forming said conductive member in said opening in said reduced height layer stack.

2. The method of claim 1, wherein forming said feature above a semiconducting substrate comprises forming a feature comprised of at least one of a transistor, a resistor, a capacitor, a gate electrode and a local interconnect.

3. A method, comprising:

forming a feature above a semiconducting substrate;

forming a plurality of stress-inducing layers above said substrate and said feature such that the stress-inducing layers overlap above said feature to form a layer stack above said feature, said layer stack having an original height, each of the stress-inducing layers having a portion formed over said substrate for inducing a stress condition in said substrate;

forming a plurality of etch stop layers that alternate with the plurality of stress-inducing layers;

reducing said original height of said layer stack to thereby define a reduced height layer stack above said feature, wherein reducing said original height of said layer stack comprises removing an overlapping portion of at least one of the stress-inducing layers in the layer stack while retaining the portions of the stress-inducing layers formed over said substrate in regions adjacent said feature, and wherein reducing said original height of said layer stack comprises removing an overlapping portion of at least one of the etch stop layers in the layer stack while retaining the etch stop layers formed above said substrate in regions adjacent said feature;

forming an opening in said reduced height layer stack for a conductive member that will be electrically coupled to said feature; and forming said conductive member in said opening in said reduced height layer stack.

4. The method of claim 1, wherein forming the plurality of stress-inducing layers comprises forming first and second stress-inducing layers above different portions of said substrate so that the first and second stress-inducing layers overlap above said feature, and wherein removing the overlapping portion of the layer stack comprises removing substantially all of the first stress-inducing layer above said feature while retaining a portion of the first stress-inducing layer formed adjacent said feature and retaining the second stress-inducing layer.

5. The method of claim 1, wherein forming said layer stack comprised of a plurality of layers of material above said feature comprises forming a layer stack comprised of four layers of material above said feature.

6. The method of claim 1, wherein reducing said original height of said layer stack to thereby define a reduced height layer stack above said feature comprises performing a planarization process to reduce the original height of said layer stack.

7. The method of claim 1, wherein reducing said original height of said layer stack to thereby define a reduced height layer stack above said feature comprises performing a chemical mechanical polishing process to reduce the original height of said layer stack.

8. The method of claim 1, wherein reducing said original height of said layer stack to thereby define a reduced height layer stack above said feature comprises performing an etching process to reduce the original height of said layer stack.

9. The method of claim 1, wherein reducing said original height of said layer stack to thereby define a reduced height layer stack above said feature comprises:

spin-coating a layer of material on said substrate, thereby exposing at least a portion of said layer stack; and performing an etching process on said exposed portions of said layer stack to reduce said original height of said layer stack and thereby define said reduced height layer stack.

10. The method of claim 1, wherein forming said opening in said reduced height layer stack comprises performing an etching process to form said opening in said reduced height layer stack.

11. The method of claim 1, wherein said conductive member is comprised of at least one of a metal or polysilicon.

* * * * *